(12) United States Patent
Morris et al.

(10) Patent No.: US 6,884,661 B1
(45) Date of Patent: Apr. 26, 2005

(54) METHOD OF FABRICATING POSTS OVER INTEGRATED HEAT SINK METALLIZATION TO ENABLE FLIP CHIP PACKAGING OF GAAS DEVICES

(75) Inventors: Thomas Scott Morris, Clemmons, NC (US); Milind Shah, Greensboro, NC (US); Jon Jorgenson, Greensboro, NC (US)

(73) Assignee: RF Micro Devices, Inc., Greensboro, NC (US)

(*) Notice: Subject to any disclaimer, the term of this patent is extended or adjusted under 35 U.S.C. 154(b) by 0 days.

(21) Appl. No.: 10/701,754

(22) Filed: Nov. 4, 2003

(51) Int. Cl.[7] .............................................. H01L 21/48
(52) U.S. Cl. ................................................. 438/122
(58) Field of Search .............................. 438/106, 108, 438/122, 612, 613; 228/179, 180.21, 180.22; 29/825, 829, 842, 854, 857, 874, 876, 884; 257/706, 707, 712, 713, 717, 720, 738, 778; 361/704, 707, 709–711

(56) References Cited

U.S. PATENT DOCUMENTS

| | | | |
|---|---|---|---|
| 5,436,497 A | 7/1995 | Miyauchi et al. | ........... 257/587 |
| 5,444,300 A | 8/1995 | Sato et al. | ................... 257/737 |
| 6,365,435 B1 | 4/2002 | Wang et al. | ................ 438/108 |
| 6,510,976 B1 | 1/2003 | Hwee et al. | ........... 228/180.22 |
| 6,578,754 B1 | 6/2003 | Tung | ...................... 228/180.22 |
| 6,592,019 B1 | 7/2003 | Tung | ........................... 228/197 |
| 6,599,775 B1 | 7/2003 | Tie et al. | ..................... 438/108 |
| 6,681,982 B1 | 1/2004 | Tung | ........................... 228/197 |
| 6,683,384 B1 * | 1/2004 | Kossives et al. | ............ 257/777 |
| 6,724,084 B1 * | 4/2004 | Hikita et al. | ................ 257/737 |
| 2003/0127502 A1 | 7/2003 | Alvarez | ....................... 228/246 |

OTHER PUBLICATIONS

H. Sato, M. Miyaúchi, M. Akagi, M. Hasegawa, J.K. Twynam, K. Yamamura, and T. Tomita, "Bump Heat Sink Technology—A Novel Assembly Technology Suitable for Power HBTs," IEEE:GaAs IC Symposium, pp. 337–340, 1993.

* cited by examiner

Primary Examiner—Alonzo Chambliss
(74) Attorney, Agent, or Firm—Withrow & Terranova, PLLC

(57) ABSTRACT

The present invention provides for attaching a Gallium Arsenide (GaAs) semiconductor die to a package using bumps formed over a metallic heat sink covering the output transistor area of the semiconductor die. In general, one or more bumps are formed on the metallic heat sink, thereby eliminating stress on the bumps caused by stress risers on the surface of the semiconductor die. In addition, the upper and lower surfaces of the bumps are substantially planar, thereby maximizing contact with the semiconductor die and the package and allowing maximum heat transfer. The planarization is due to the conforming contact surface of the solder. The combination of the bumps and the metallic heat sink provide an efficient way to reduce the thermal and electrical impedance of the die. In one embodiment, the bumps are substantially copper. In another embodiment, the bumps are substantially gold.

17 Claims, 3 Drawing Sheets

US 6,884,661 B1

METHOD OF FABRICATING POSTS OVER INTEGRATED HEAT SINK METALLIZATION TO ENABLE FLIP CHIP PACKAGING OF GAAS DEVICES

FIELD OF THE INVENTION

The present invention relates to flip chip packaging of a semiconductor die, and more particularly relates to flip chip packaging of a Gallium Arsenide (GaAs) semiconductor die.

BACKGROUND OF THE INVENTION

Flip chip packaging is the process of connecting a semiconductor die to a package, such as a leadframe or a substrate, without the use of wire bonds. In general, numerous conductive bumps are placed on an upper surface of the semiconductor die, and the die is then flipped over and placed on the package. The conductive bumps are typically formed using solder or conductive epoxy and are 70–100 $\mu$m high and 100–125 $\mu$m in diameter. With the emergence of Gallium Arsenide (GaAs) devices, the size and pitch of solder bumps prohibit the use of solder with GaAs devices. Further, due to the pitch of solder bumps, contact with the die and substrate are not maximized and results in less than maximum heat transfer. Conductive epoxy traps heat in the semiconductor die, thereby increasing the temperature gradient of the device and decreasing the efficiency of the device.

Thus, there remains a need for an improved means for attaching a GaAs die to a package.

SUMMARY OF THE INVENTION

The present invention provides for attaching a Gallium Arsenide (GaAs) semiconductor die to a package using bumps formed over a metallic heat sink covering the output transistor area of the semiconductor die. In general, one or more bumps are formed on the metallic heat sink, thereby eliminating stress on the bumps caused by stress risers on the surface of the semiconductor die. In addition, the upper and lower surfaces of the bumps are substantially planar once soldered, thereby maximizing contact with the semiconductor die and the package and allowing maximum heat transfer. The planarization is due to the conforming contact surface of the solder. The combination of the bumps and the metallic heat sink provide an efficient way to reduce the thermal and electrical impedance of the die. In one embodiment, the bumps are substantially copper. In another embodiment, the bumps are substantially gold.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
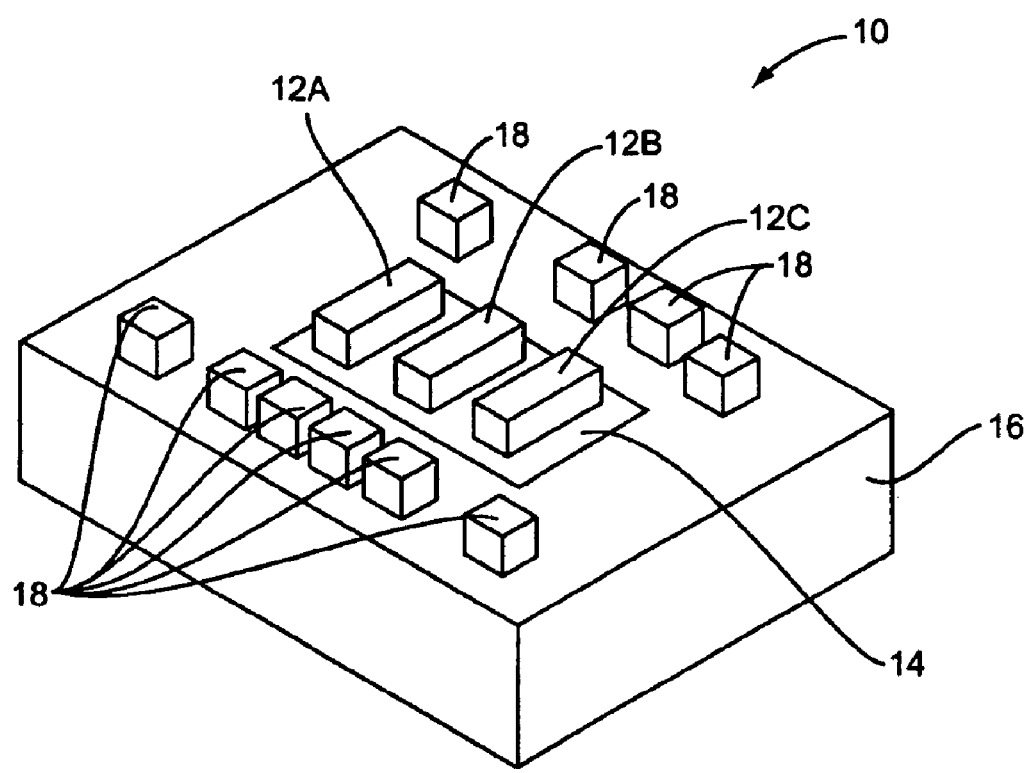
FIG. 1 illustrates a flip chip semiconductor die including bumps formed over a metallic heat sink according to one embodiment of the present invention.

FIG. 1 illustrates a flip chip 10 having bumps 12A–12C formed over a metallic heat spreader 14 according to the present invention. The metallic heat spreader 14 may also be called an integrated heat sink (IHS). The metallic heat spreader 14 is formed over an output transistor area of a semiconductor die 16, wherein the semiconductor die 16 is formed of semiconductor material such as a Gallium Arsenide (GaAs). The output transistor area is the section of the semiconductor die 16 wherein the output transistors are formed. The combination of the bumps 12A–12C and the metallic heat spreader 14 reduces the temperature gradient on the semiconductor die 16 and also reduces the stress on the bumps 12A–12C. In one embodiment, the bumps 12A–12C and the metallic heat spreader 14 provide a ground for the semiconductor die 16. The flip chip 10 may also include numerous peripheral bumps 18 that may or may not be formed over the metallic heat spreader 14 or additional metallic heat spreaders (not shown). Further, each of the peripheral bumps 18 may be formed on a separate metallic heat spreader (not shown). In one embodiment, the bumps 12A–12C and 18 are copper bumps. In another embodiment, the bumps 12A–12C and 18 are gold bumps.

Typically, epoxy is used to attach the semiconductor die 16 to a package carrier (not shown), such as a leadframe or a substrate, thereby causing heat to be trapped in the semiconductor die 16 and in the metallic heat spreader 14. By using the bumps 12A–12C directly over the metallic heat spreader 14, heat is removed from the semiconductor die 16 quickly and efficiently. The metallic heat spreader 14 also reduces the stress on the bumps 12A–12C. The metallic heat spreader 14 forms a planar surface under the bumps 12A–12C, thereby eliminating stress risers below the bumps 12A–12C. Stress risers are imperfections in the semiconductor die 16 that may cause stress on the bumps 12A–12C. Further, in typical flip chip bumps, the under bump metallurgy is close to the same size as the bump, thereby concentrating stress close to the base of the bump. By using the metallic metallization layer 14 that is significantly larger than the size of the bumps 12A–12C, the stress caused by stress risers below the metallic heat spreader 14 is distributed across the area of the metallic heat spreader 14, thereby reducing shearing stresses acting on the bumps 12A–12C and the underlying devices in the semiconductor die 16. Since the stress is distributed by the metallic heat spreader 14, the bumps 12A–12C may be formed in any desirable shape.

Figure 2A:
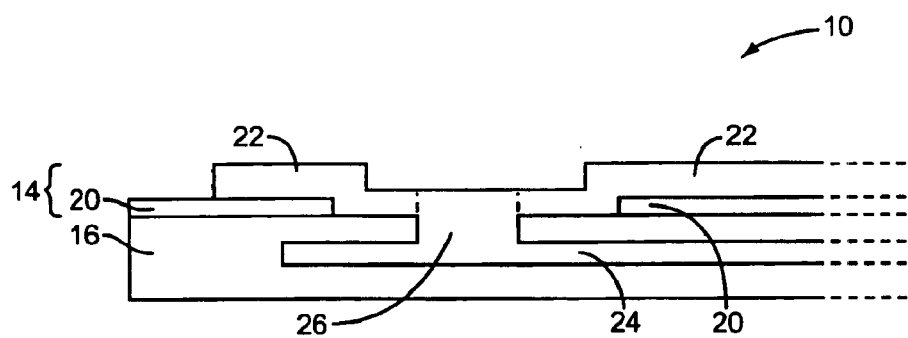
FIGS. 2A–2H illustrate a process for forming bumps over a metallic heat sink on a flip chip semiconductor die according to one embodiment of the present invention.

FIGS. 2A–2H illustrate the process for forming the bumps 12A–12C and/or the peripheral bumps 18 over the metallic heat spreader 14 on the semiconductor die 16 and mounting the semiconductor die 16 on a package, such as a leadframe or a substrate. It is important to note that FIGS. 2A–2G illustrate the formation of one of the bumps 12A–12C, which are generally referred to as bump 12. It should also be noted that the peripheral bumps 18 may also be formed using the process of FIGS. 2A–2G. FIG. 2A is a cross-sectional view of a portion the flip chip 10 prior to the formation of the bump 12. As illustrated, the metallic heat spreader 14 includes a passivation layer 20 and a metallic contact pad 22, arranged as shown. The contact pad 22 is connected to an active metal layer 24 within the semiconductor die 16 by a via 26, which is filled with a conductive material. In one embodiment, the passivation layer 20 is silicon dioxide ($SiO_2$), the contact pad is formed of gold, and the via 26 is filled with gold. As is known in the art, semiconductor devices within the semiconductor die 16 are connected to the active metal layer 24. For example, the collectors of transistors in the output transistor area of the semiconductor die may be connected to the active metal layer 24, which is then to be connected to ground.

Figure 2B:
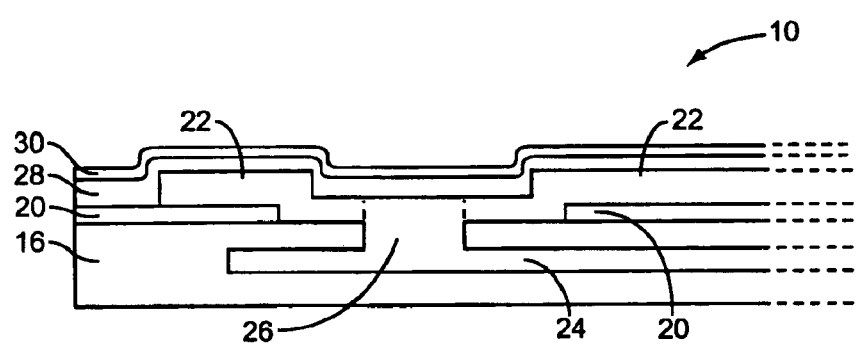
Figure 2C:
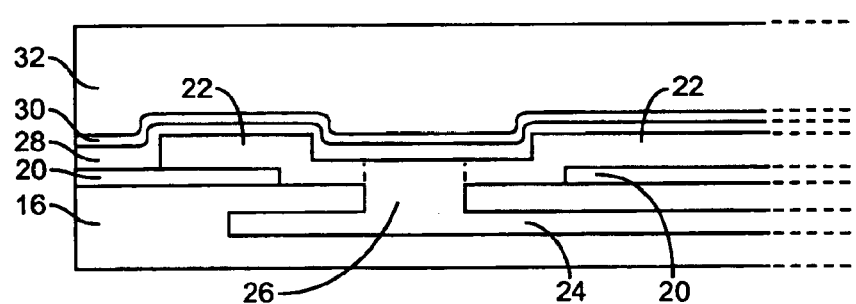
Figure 2D:
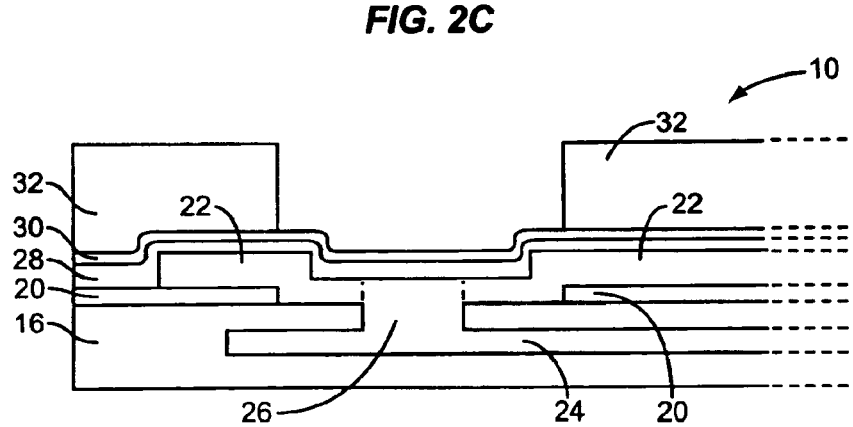
Figure 2E:
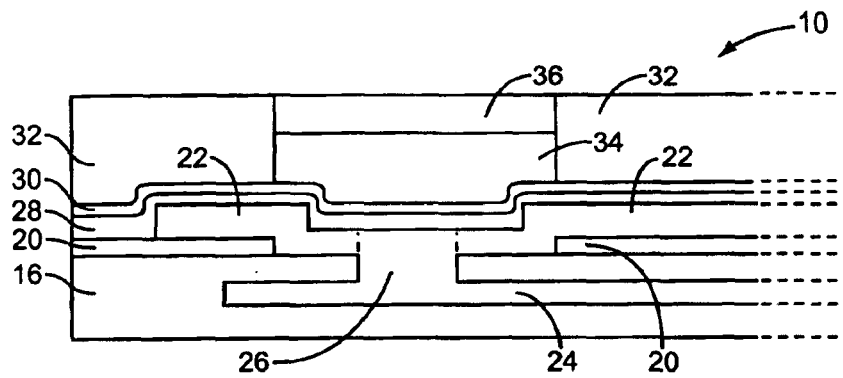
Figure 2F:
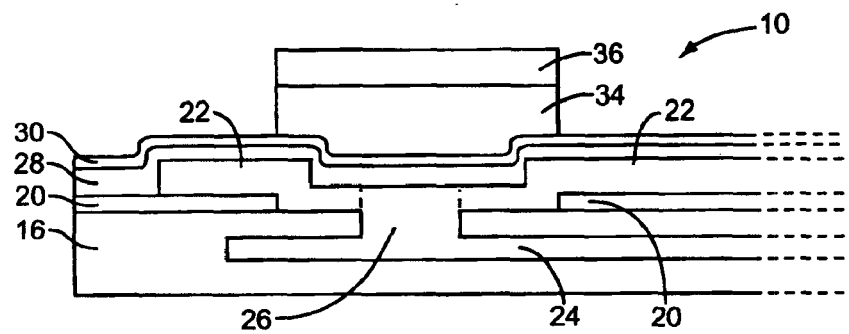
Figure 2G:
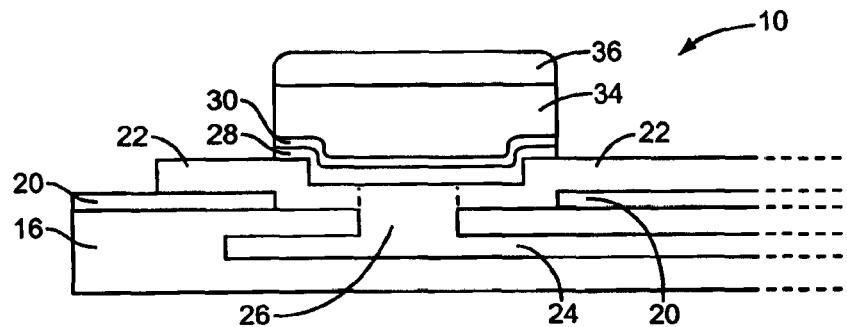
Figure 2H:
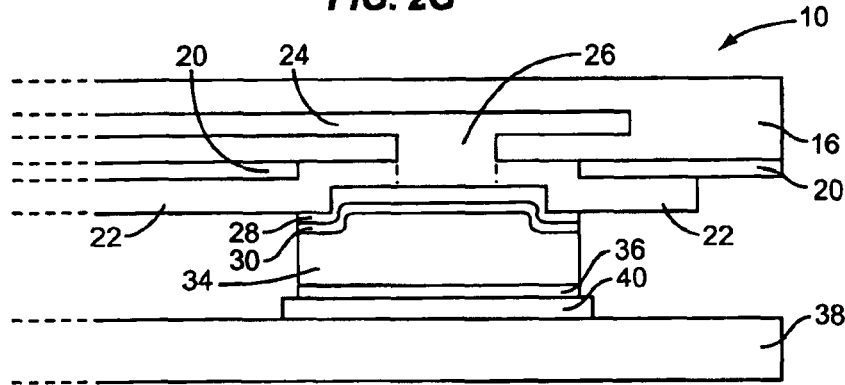

As illustrated in FIG. 2B, additional barrier layers 28 and 30 may be deposited on the flip chip 16. In one embodiment, the layer 28 is titanium and the layer 30 is copper. However, the layers 28 and 30 may comprise numerous materials such as titanium, titanium tungsten, vanadium, nickel, chromium, copper, and gold. Further, the layers 28 and 30 may be replaced by a single layer of titanium, titanium tungsten, vanadium, chromium, copper, or gold. Combined, the layers 28 and 30 operate as a barrier, adhesion, and current carrying layer and are beneficial if the bump 12 is formed using electroplating. Next, as illustrated in FIG. 2C, a photoresist layer 32 is deposited on the flip chip 10. As illustrated in FIG. 2D, the photoresist layer 32 is etched in the area where the bump 12 is to be formed. After the photoresist layer 32 is etched, the bump 12 is formed in the area where the photoresist layer 32 is etched (FIG. 2E). As illustrated in FIG. 2E, the bump 12 includes a stud layer 34 and a solder layer 36. In one embodiment, the stud layer 34 and the solder layer 36 are formed using electroplating. Preferably, the stud layer 34 is either copper or gold. Once the bump 12 is formed, the photoresist layer 32 is removed, as shown in FIG. 2F. Thereafter, the exposed regions of the layers 28 and 30 are removed by etching, and the solder layer 36 is heated during reflow (FIG. 2G). As illustrated in FIG. 2H, the flip chip 10 is "flipped", the solder layer 36 is heated, and the flip chip 10 is mounted on a package carrier 38, such as a leadframe or a substrate. The flip chip 10 is positioned on the package carrier 38 such that the stud layer 34 and the solder layer 36 connect to a contact pad 40 of the package carrier 38. The contact pad 40 may have plated or screen printed solder to aid in the adhesion.

As shown in FIGS. 2E–2G, the upper and lower surfaces of the stud layer 34 of the bump 12 are substantially planar, thereby maximizing contact with the semiconductor die 16 and the package carrier. In addition, by forming the bump 12 with either copper or gold, the bump 12 has a tighter pitch, has a constant stand-off height, and can be formed in multiple shapes and sizes.

The present invention provides substantial opportunity for variation without departing from the spirit and scope of the invention. For example, although FIG. 1 illustrates bumps 12A–12C, the bumps 12A–12C may be replaced by a single large bump that covers all transistor rows of the semiconductor device 16. As another example, each of the bumps 12A–12C may be replaced by numerous bumps covering a single or multiple transistors instead of an entire transistor row. As yet another example, the number of transistor rows in the output transistor area of the semiconductor die 16 depends on the particular design. Thus, there may be any number of bumps 12 on the metallic heat spreader 14.

Those skilled in the art will recognize improvements and modifications to the preferred embodiments of the present invention. All such improvements and modifications are considered within the scope of the concepts disclosed herein and the claims that follow.

What is claimed is:

1. A method for forming bumps on a flip chip die comprising:

providing a semiconductor die;

forming a metallic heat spreader over an output transistor area of the semiconductor die, wherein the output transistor area is a portion of a surface area of the semiconductor die above a plurality of output transistors formed within the semiconductor die; and forming at least one bump over the metallic heat spreader.

2. The method of claim 1 wherein forming the at least one bump comprises:

forming at least one metallic layer including a metallic stud layer over the metallic heat spreader, the metallic stud layer having a substantially planar surface; and forming a solder layer over the at least one metallic layer for electrically connecting the semiconductor die to a flip chip package.

3. The method of claim 2 wherein the substantially planar surface of the metallic stud layer provides efficient heat transfer from the semiconductor die to the flip chip package.

4. The method of claim 2 wherein the stud layer is essentially copper.

5. The method of claim 4 wherein the copper stud layer and the solder layer are formed using electroplating.

6. The method of claim 2 wherein the stud layer is essentially gold.

7. The method of claim 6 wherein the gold stud layer and the solder layer are formed using electroplating.

8. The method of claim 1 wherein the metallic heat spreader substantially eliminate stress risers below the at least one bump.

9. The method of claim 1 wherein the semiconductor die is a Gallium Arsenide (GaAs) semiconductor die.

10. The method of claim 1 wherein the step of forming the metallic heat spreader comprises depositing a passivation layer on the surface of the semiconductor die.

11. The method of claim 10 wherein the step of forming the metallic heat spreader further comprises forming a metallic contact pad on the passivation layer.

12. The method of claim 11 wherein the metallic contact pad is substantially gold.

13. The method of claim 11 wherein the at least one bump is formed over the contact pad.

14. The method of claim 13 further comprising electrically connecting the metallic contact pad to an active layer of the semiconductor die below the at least one bump, thereby electrically connecting the at least one bump to the active metal layer of the semiconductor die.

15. The method of claim 14 wherein the electrically connecting step comprises forming vias through the contact pad to the active metal layer and filling the vias with a conductive material.

16. The method of claim 1 wherein the at least one bump has an essentially vertical pitch.

17. The method of claim 1 wherein the at least one bump provides a constant stand-off height between the semiconductor die and the flip chip package.

* * * * *